(12) United States Patent
Lee et al.

(10) Patent No.: US 9,718,680 B2
(45) Date of Patent: Aug. 1, 2017

(54) CMOS-MEMS INTEGRATED DEVICE INCLUDING A CONTACT LAYER AND METHODS OF MANUFACTURE

(71) Applicant: InvenSense, Inc., San Jose, CA (US)

(72) Inventors: Daesung Lee, Palo Alto, CA (US); Jongwoo Shin, Pleasanton, CA (US); Jong Il Shin, San Jose, CA (US); Peter Smeys, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/738,645

(22) Filed: Jun. 12, 2015

(65) Prior Publication Data
US 2016/0362296 A1 Dec. 15, 2016

(51) Int. Cl.
*H01L 21/768* (2006.01)
*B81C 1/00* (2006.01)
*H01L 23/522* (2006.01)

(52) U.S. Cl.
CPC .... *B81C 1/00301* (2013.01); *H01L 21/76877* (2013.01); *H01L 21/76898* (2013.01); *H01L 23/5226* (2013.01); *B81C 2201/013* (2013.01); *B81C 2203/036* (2013.01)

(58) Field of Classification Search
CPC ... H01L 21/02518; H01L 21/64; H01L 21/70; H01L 21/71
See application file for complete search history.

(56) References Cited

U.S. PATENT DOCUMENTS

| | | | | |
|---|---|---|---|---|
| 8,564,076 B1* | 10/2013 | Huang | ................. | B81B 7/0064 257/414 |
| 2013/0316529 A1* | 11/2013 | Golda | ............... | H01L 21/76898 438/637 |

* cited by examiner

*Primary Examiner* — Cheung Lee
(74) *Attorney, Agent, or Firm* — Amin, Turocy & Watson, LLP

(57) ABSTRACT

A method for forming a MEMS device is disclosed. The MEMS device includes a MEMS substrate and a base substrate. The MEMS substrate, where includes a handle layer, a device layer and an insulating layer in between. The method includes the sequential steps of: providing a standoff on the device layer; etching a via through the device layer and the insulating layer; providing a contact layer within the via, wherein the contact layer provides electrical connection between the device layer and the handle layer; providing a bonding layer on the standoff; and bonding the bonding layer to pads on the base substrate.

10 Claims, 3 Drawing Sheets

CMOS-MEMS INTEGRATED DEVICE INCLUDING A CONTACT LAYER AND METHODS OF MANUFACTURE

FIELD OF THE INVENTION

The present invention relates to microelectromechanical systems (MEMS) devices, and more particularly, to a complementary metal-oxide-semiconductor (CMOS)-MEMS integrated device with including a contact layer

BACKGROUND

Cover contact to MEMS surface after a chemical mechanical polishing (CMP) for products that require photolithography and patterning on the ground surface of MEMS during CMOS-MEMS backend process) is currently achieved by utilizing a poly via.

A CMOS-MEMS backend process covers all remaining steps after bonding of CMOS and MEMS wafers. For CMOS-MEMS integrated devices that have a minimal CMOS-MEMS backend process comprising MEMS grinding, CMOS grinding, MEMS side metallization, and tab dicing, a cover contact or contact layer (the electrical contact to MEMS substrate) is achieved by a conductive metal such as Aluminum/Copper (AlCu) sputtered on the ground surface of MEMS substrate that is then wirebonded.

For CMOS-MEMS integrated devices in which the CMOS-MEMS backend process requires photolithography and patterning on the ground surface of MEMS or CMOS, it is challenging to create a cover contact from the ground MEMS surface because of the difficulty in patterning the deposited cover contact on a non-planar topography. In addition, the material selection for the cover contact is limited (e.g. AlCu) due to thermal budget constraint in backend process. Poly via process has been developed and validated to provide cover contact for such products. Poly via is formed in device layer of MEMS wafer before bonding to CMOS wafer. Poly via step is inserted after wafer thinning for forming the device layer in the MEMS wafer. The standoff pattern, Ge pattern, and actuator etch follow the poly via step. However, the poly via process requires high temp annealing (~1100° C.) for drive-in and stress relaxation that may affect the property of the fusion bond oxide. Accordingly, what is needed is a system and method that overcomes the above identified issues. The present invention addresses such a need.

SUMMARY

A method for forming a MEMS device is disclosed. The MEMS device includes a MEMS substrate and a base substrate. The MEMS substrate, where includes a handle layer, a device layer and an insulating layer in between. The method includes the sequential steps of: providing a standoff on the device layer; etching a via through the device layer and the insulating layer; providing a contact layer within the via, wherein the contact layer provides electrical connection between the device layer and the handle layer; providing a bonding layer on the standoff; and bonding the bonding layer to pads on the base substrate.

DETAILED DESCRIPTION

Figure 1:
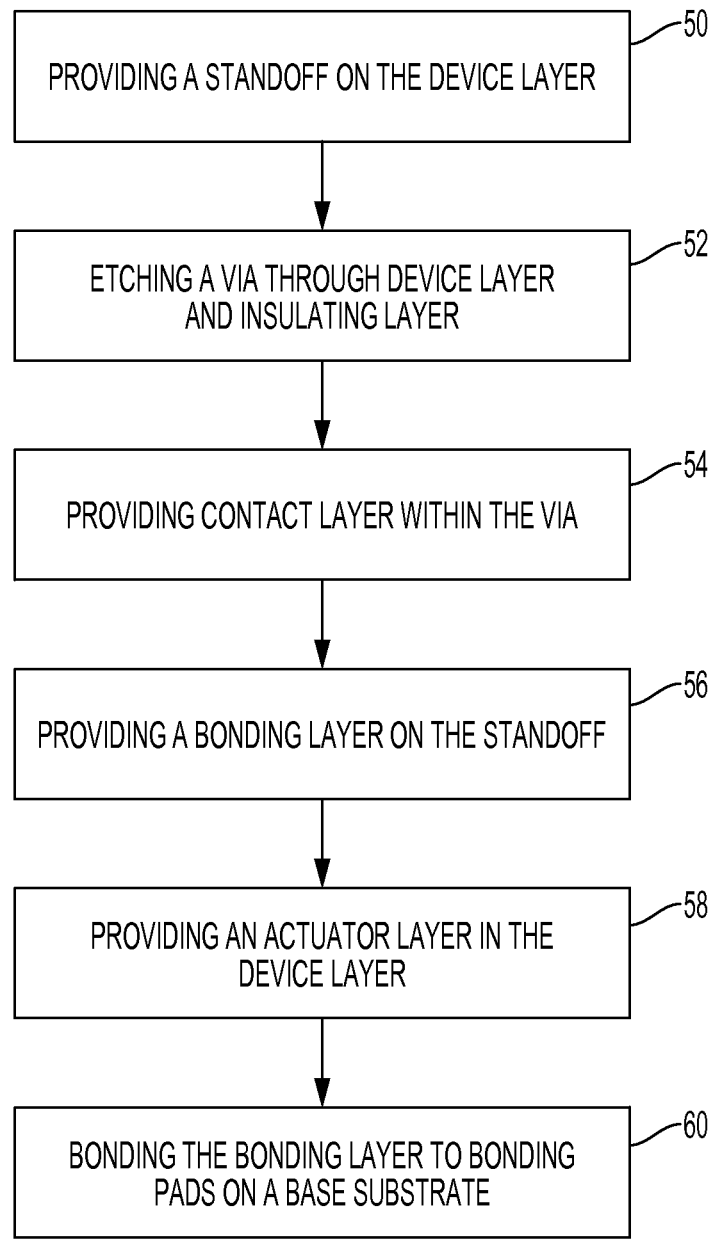
FIG. 1 is a flow chart of a process flow for providing a contact layer in accordance with an embodiment.

The present invention relates to microelectromechanical systems (MEMS) devices, and more particularly, to a complementary metal-oxide-semiconductor (CMOS)-MEMS integrated device with including a contact layer.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electromechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Bond chamber may be an enclosure in a piece of bonding equipment where the wafer bonding process takes place. The atmosphere in the bond chamber determines the atmosphere sealed in the bonded wafers.

Additionally, a system and method in accordance with the present invention describes a class of RF MEMS devices, sensors, and actuators including but not limited to switches, resonators and tunable capacitors that are hermetically sealed and bonded to integrated circuits that may use capacitive sensing and electrostatic, magnetic, or piezo-electric actuation.

A system and method in accordance with the present invention provides a contact layer in a CMOS-MEMS integrated device through deposition of the contact layer into a via formed in the device layer of the integrated device. Through the use of the system and method more materials can be utilized a s a contact layer when producing CMOS-MEMS integrated devices and the process temperature is mainly determined by the deposition temperature of the contact layer. To describe the features of the present invention in more detail refer now to the following discussion in conjunction with the accompanying Figures.

Figure 2A:
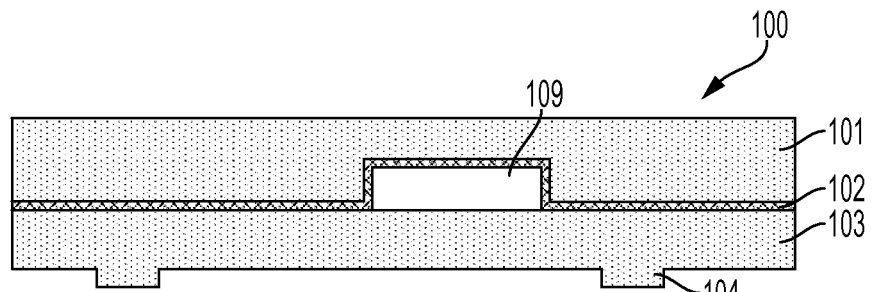
FIGS. 2A-2F are diagrams that illustrate the process flow of FIG. 1.
Figure 2B:
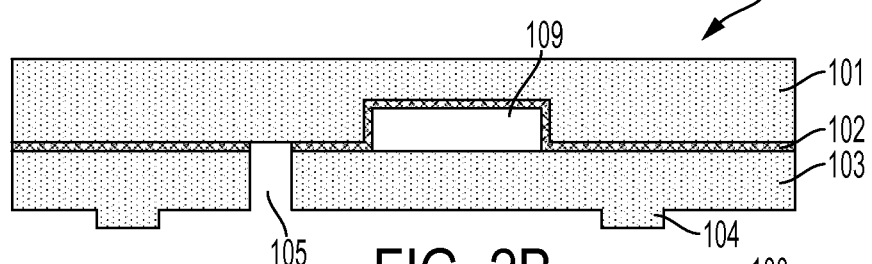

FIG. 1 is a flow chart of a process flow for providing a contact layer in accordance with an embodiment. FIGS. 2A-2F are diagrams that illustrate the process flow of FIG. 1. Referring to FIGS. 1 and 2A-2E together, first a standoff 104 is provided on a device layer 103 of a MEMS substrate 100, via step 50. FIG. 2A shows the MEMS substrate 100 that includes a handle layer 101, a device layer 103 and an insulating layer 102 therebetween. In this embodiment a cavity 109 is located within the MEMS substrate between device layer 103 and the handle layer 101. In an embodiment, the insulating layer 102 is an oxide layer. In an embodiment a standoff 104 is patterned on the device layer 103. Next, in a process in accordance with an embodiment, a via 105 is etched through the device layer 103 and the insulating layer 102, via step 52. FIG. 2B illustrates the via 105 being etched through the device layer 103 and the oxide layer 102. In an alternate embodiment the via etch can also etch a stack of the device layer 103, oxide layer 102, and a partial through the handle layer 101.

Figure 2C:
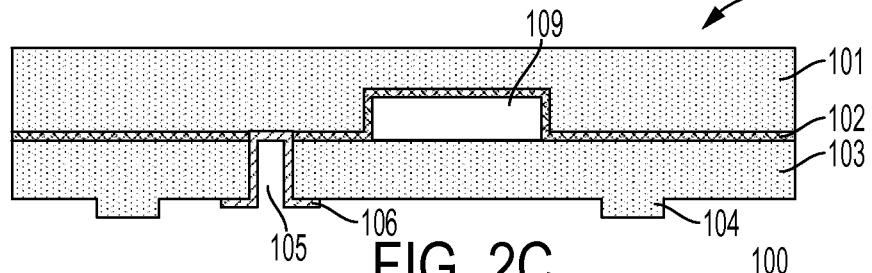

Next, a contact layer 106 is provided within the via 105, wherein the contact layer 106 provides electrical connection between the device layer 103 and the handle layer 101, via step 54. In an embodiment, the contact layer 106 is provided by patterning and etching the device layer 103. FIG. 2C illustrates the deposition and patterning of the contact layer 106. The contact layer 106 can line the via 105, can fill the via 105 or partially fill the via 105 depending upon the process constraints. Example materials the contact layer 106 include but are not limited to any of polysilicon, aluminum/copper, tungsten, titanium, titanium nitride, aluminum, or germanium. In an embodiment the via 105 profile can be tuned (e.g. vertical or tapered) to best accommodate various deposition methods including but not limited to chemical vapor deposition (CVD), atomic layer deposition (ALD), and physical vapor deposition (PVD). In addition, the patterning of the contact layer 106 can be provided by anisotropic or isotropic etch.

Figure 2D:
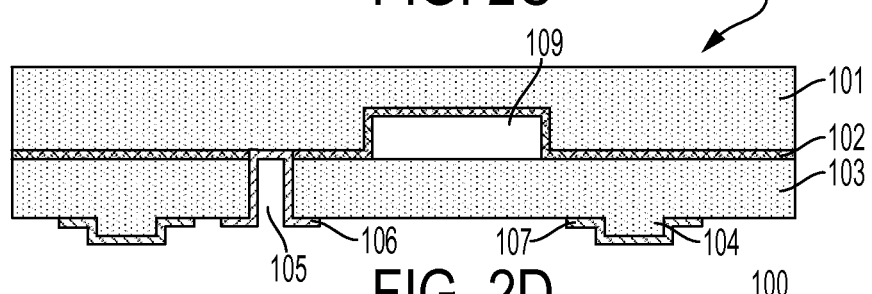

Next a bonding layer 107 is provided on the standoff 104, via step 56. In an embodiment, the bonding layer 107 is provided by depositing and patterning the standoff 104. FIG. 2D shows the deposition and patterning of the bonding layer 107. Example materials for the bonding layer include but are not limited to any of copper, tungsten, aluminum, or germanium.

In an embodiment where the contact layer 106 is the same as the bonding layer 107, two steps shown in FIGS. 2C and 2D can performed substantially simultaneously. In that embodiment, only a single deposition and patterning is needed.

Figure 2E:
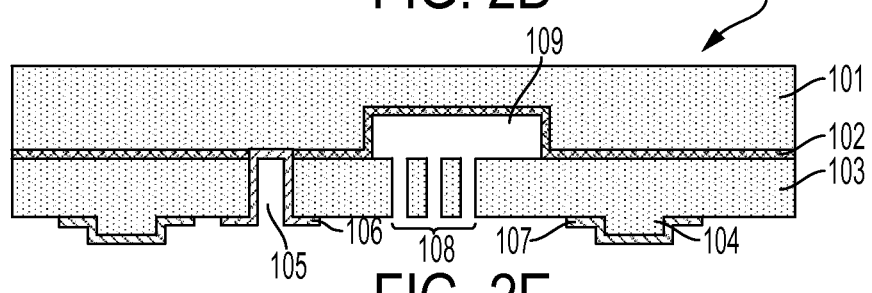
Figure 2F:
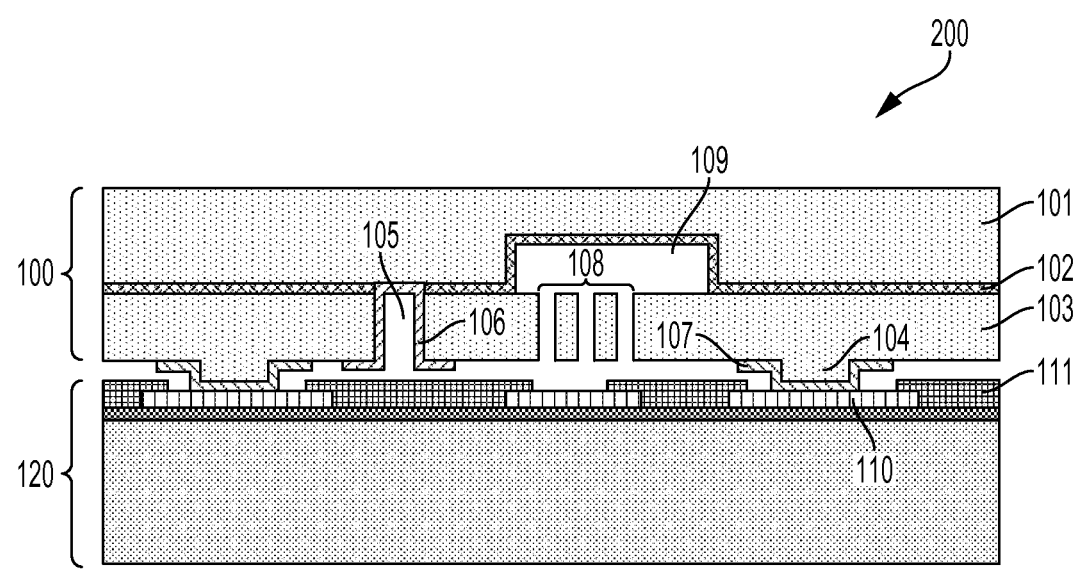

Thereafter an actuator layer 108 is provided in the device layer 103, via step 58. In an embodiment, the actuator layer 108 is provided by an etching step. FIG. 2E illustrates etching of the actuator layer 108. In some embodiments a release step may be needed (i.e. etch away an oxide layer between device layer 103 and handle layer 101 so that structures in the device layer can move) to provide the actuator layer 108. Finally, the bonding layer 107 is bonded to pads 110 on a base substrate 120 to form the CMOS-MEMS device 200, via step 60. FIG. 2F illustrates bonding the base substrate 120 to the MEMS substrate 100. In an embodiment, the base substrate 120 includes a passivation layer 111 thereon. In an embodiment the base substrate 120 comprises a CMOS substrate. In an embodiment, bonding can be any of eutectic bonding between Al and Ge as described in U.S. application Ser. No. 11/084,296, filed on Mar. 18, 2005, now issued as U.S. Pat. No. 7,442,570, entitled "Method of Fabrication of Al/Ge Bonding in a Wafer Packaging Environment and a Product Produced Therefrom," assigned to the applicant of the present application, which is incorporated by reference herein and other bonding techniques including but not limited to, fusion bonding, thermal compression bonding, glass frit, solder, and adhesive bonding.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for forming a MEMS device, wherein the MEMS device includes a MEMS substrate and a base substrate; wherein the MEMS substrate includes a handle layer, a device layer and an insulating layer in between, the method comprising:
providing a standoff on the device layer;
etching a via through only the device layer and the insulating layer;
providing a contact layer within the via by depositing and patterning a first conductive material within the via to comprise a liner within the via, wherein the contact layer provides a direct electrical connection between the device layer and the handle layer, and wherein the first conductive material is deposited within the via over the device layer and the insulation layer, and the first conductive material forms an electrical contact with the handle layer;
providing a bonding layer on the standoff; and
bonding the bonding layer to pads on the base substrate.

2. The method of claim 1, further comprising providing an actuator in the device layer before the bonding.

3. The method of claim 1, further comprising providing a eutectic bond.

4. The method of claim 1, further comprising patterning the device layer to provide the standoff.

5. The method of claim 1, wherein the first conductive material fills the via.

6. The method of claim 1, further comprising depositing and patterning a second conductive material on the standoff.

7. The method of claim 6, wherein the first conductive material and the second conductive material are the same material, further comprising performing the bonding and the providing the contact layer substantially simultaneously.

8. The method of claim 1, wherein the contact layer comprises any of polysilicon, aluminum/copper, tungsten, titanium, titanium nitride, aluminum, or germanium.

9. The method of claim 1, wherein the bonding layer comprises any of copper, tungsten, aluminum, or germanium.

10. The method of claim 1, wherein the first conductive material is in direct electrical contact with the handle layer.

* * * * *